(12) United States Patent
Kapusta et al.

(10) Patent No.: US 10,541,209 B2
(45) Date of Patent: Jan. 21, 2020

(54) ELECTRONICS PACKAGE INCLUDING INTEGRATED ELECTROMAGNETIC INTERFERENCE SHIELD AND METHOD OF MANUFACTURING THEREOF

(71) Applicant: General Electric Company, Schenectady, NY (US)

(72) Inventors: Christopher James Kapusta, Delanson, NY (US); Raymond Albert Fillion, Niskayuna, NY (US); Risto Ilkka Sakari Tuominen, Tokyo (JP); Kaustubh Ravindra Nagarkar, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/668,553

(22) Filed: Aug. 3, 2017

(65) Prior Publication Data

US 2019/0043810 A1    Feb. 7, 2019

(51) Int. Cl.
| | |
|---|---|
| *H01L 21/48* | (2006.01) |
| *H01L 21/56* | (2006.01) |
| *H01L 21/52* | (2006.01) |
| *H01L 23/28* | (2006.01) |
| *H01L 23/552* | (2006.01) |

(52) U.S. Cl.
CPC ......... *H01L 23/552* (2013.01); *H01L 21/486* (2013.01); *H01L 21/4857* (2013.01); *H01L 21/4885* (2013.01); *H01L 21/52* (2013.01); *H01L 21/56* (2013.01); *H01L 2924/3025* (2013.01)

(58) Field of Classification Search
CPC ....... H01L 21/52; H01L 21/56; H01L 23/552; H01L 21/48

USPC .......................................... 257/660, 770–774
See application file for complete search history.

(56) References Cited

U.S. PATENT DOCUMENTS

| | | | |
|---|---|---|---|
| 6,306,680 | B1 | 10/2001 | Fillion et al. |
| 6,433,412 | B2 | 8/2002 | Ando et al. |
| (Continued) | | | |

FOREIGN PATENT DOCUMENTS

| | | |
|---|---|---|
| JP | 2004-281541 A | 10/2004 |
| KR | 2015-0042362 A | 4/2015 |

OTHER PUBLICATIONS

Ozmat et al., "A New Power Module Packaging Technology for Enhanced Thermal Performance," The Seventh Intersociety Conference on Thermal and Thermomechanical Phenomena in Electronic Systems, May 23-26, 2000, pp. 287-296.

(Continued)

*Primary Examiner* — Sheikh Maruf
(74) *Attorney, Agent, or Firm* — Ziolkowski Patent Solutions Group, SC

(57) ABSTRACT

An electronics package includes a support substrate, an electrical component having a first surface coupled to a first surface of the support substrate, and an insulating structure coupled to the first surface of the support substrate and sidewalls of the electrical component. The insulating structure has a sloped outer surface. A conductive layer encapsulates the electrical component and the sloped outer surface of the insulating structure. A first wiring layer is formed on a second surface of the support substrate. The first wiring layer is coupled to the conductive layer through at least one via in the support substrate.

22 Claims, 10 Drawing Sheets

(56) References Cited

U.S. PATENT DOCUMENTS

| | | | |
|---|---|---|---|
| 7,752,751 B2 | 7/2010 | Kapusta et al. | |
| 7,777,351 B1 | 8/2010 | Berry et al. | |
| 7,902,660 B1 | 3/2011 | Lee et al. | |
| 8,115,117 B2 | 2/2012 | Kapusta et al. | |
| 8,276,268 B2 | 10/2012 | Kapusta et al. | |
| 9,337,163 B2 | 5/2016 | Delgado et al. | |
| 9,391,027 B2 | 7/2016 | Chauhan et al. | |
| 2002/0017721 A1* | 2/2002 | Huang | H01L 21/4853 257/724 |
| 2002/0090162 A1 | 7/2002 | Asada et al. | |
| 2003/0146503 A1* | 8/2003 | Khan | H01L 23/13 257/706 |
| 2004/0155322 A1 | 8/2004 | Cho et al. | |
| 2004/0178508 A1* | 9/2004 | Nishimura | H01L 23/3128 257/778 |
| 2004/0238857 A1* | 12/2004 | Beroz | H01F 17/0033 257/232 |
| 2005/0006745 A1* | 1/2005 | Nishimura | H01L 25/105 257/686 |
| 2005/0090050 A1* | 4/2005 | Shim, II | H01L 25/0657 438/200 |
| 2005/0098885 A1* | 5/2005 | Aoyagi | H01L 21/4853 257/738 |
| 2005/0189636 A1 | 9/2005 | Savastiouk et al. | |
| 2006/0125077 A1* | 6/2006 | Akaike | H01L 22/32 257/690 |
| 2006/0151206 A1* | 7/2006 | Maruyama | H01L 23/49833 174/260 |
| 2007/0069391 A1* | 3/2007 | Gritti | H01L 25/0657 257/777 |
| 2007/0096311 A1 | 5/2007 | Humpston et al. | |
| 2008/0087996 A1* | 4/2008 | Miyaki | H01L 21/4821 257/677 |
| 2008/0179503 A1 | 7/2008 | Camargo et al. | |
| 2008/0272470 A1* | 11/2008 | Do | H01L 21/6835 257/666 |
| 2008/0315371 A1* | 12/2008 | Tang | H01L 23/29 257/659 |
| 2009/0008765 A1* | 1/2009 | Yamano | H01L 24/83 257/690 |
| 2009/0057898 A1* | 3/2009 | Takaike | H01L 21/485 257/738 |
| 2009/0075428 A1* | 3/2009 | Tang | H01L 21/561 438/114 |
| 2009/0190009 A1 | 7/2009 | Kawasaki | |
| 2009/0291296 A1 | 11/2009 | McConnelee et al. | |
| 2009/0309231 A1* | 12/2009 | Machida | H01L 21/4857 257/773 |
| 2009/0315057 A1 | 12/2009 | Konishi et al. | |
| 2010/0019338 A1 | 1/2010 | Kwon et al. | |
| 2010/0148335 A1 | 6/2010 | Mikami et al. | |
| 2010/0224992 A1* | 9/2010 | McConnelee | H01L 23/5383 257/723 |
| 2010/0230800 A1 | 9/2010 | Beaupre et al. | |
| 2010/0237477 A1* | 9/2010 | Pagaila | H01L 21/561 257/660 |
| 2010/0295178 A1 | 11/2010 | Ishihara et al. | |
| 2011/0012269 A1 | 1/2011 | Ishihara et al. | |
| 2011/0024888 A1* | 2/2011 | Pagaila | H01L 23/13 257/686 |
| 2011/0031598 A1 | 2/2011 | Lee et al. | |
| 2011/0080713 A1* | 4/2011 | Sunohara | H01L 23/147 361/760 |
| 2011/0084386 A1 | 4/2011 | Pendse | |
| 2011/0095441 A1 | 4/2011 | Fjelstad et al. | |
| 2011/0266665 A1 | 11/2011 | Gowda et al. | |
| 2011/0316140 A1* | 12/2011 | Nalla | H01L 23/5389 257/698 |
| 2012/0005887 A1* | 1/2012 | Mortensen | C25D 1/00 29/829 |
| 2012/0009738 A1* | 1/2012 | Crawford | H01L 21/6835 438/121 |
| 2012/0049339 A1 | 3/2012 | Wang | |
| 2012/0080786 A1 | 4/2012 | Furutani et al. | |
| 2012/0086109 A1 | 4/2012 | Kim et al. | |
| 2012/0112336 A1* | 5/2012 | Guzek | H01L 23/3114 257/698 |
| 2012/0126423 A1* | 5/2012 | Hatori | H01L 21/4853 257/774 |
| 2012/0139095 A1* | 6/2012 | Manusharow | H01L 23/36 257/690 |
| 2012/0139116 A1* | 6/2012 | Manusharow | H01L 21/4857 257/762 |
| 2012/0319274 A1* | 12/2012 | Tanaka | H01L 23/49816 257/738 |
| 2012/0319284 A1* | 12/2012 | Ko | H01L 24/92 257/773 |
| 2013/0052776 A1* | 2/2013 | Nalla | H01L 21/568 438/118 |
| 2013/0134559 A1 | 5/2013 | Lin et al. | |
| 2013/0256865 A1* | 10/2013 | Umeki | H01L 23/28 257/690 |
| 2014/0008785 A1 | 1/2014 | Lin et al. | |
| 2014/0029210 A1 | 1/2014 | Gowda et al. | |
| 2014/0029234 A1 | 1/2014 | Chauhan et al. | |
| 2014/0048951 A1 | 2/2014 | Lin et al. | |
| 2014/0077364 A1 | 3/2014 | Marimuthu et al. | |
| 2014/0103527 A1 | 4/2014 | Marimuthu et al. | |
| 2014/0133104 A1 | 5/2014 | Delgado et al. | |
| 2014/0138807 A1 | 5/2014 | Gowda et al. | |
| 2014/0239477 A1* | 8/2014 | Kim | H01L 23/552 257/692 |
| 2014/0252646 A1* | 9/2014 | Hung | H01L 23/481 257/774 |
| 2014/0264800 A1 | 9/2014 | Gowda et al. | |
| 2014/0312503 A1* | 10/2014 | Seo | H01L 27/14636 257/774 |
| 2014/0319679 A1* | 10/2014 | Lin | H01L 23/13 257/737 |
| 2014/0332937 A1 | 11/2014 | Brunnbauer et al. | |
| 2015/0001708 A1 | 1/2015 | Lin | |
| 2015/0069612 A1 | 3/2015 | Chauhan et al. | |
| 2015/0084207 A1 | 3/2015 | Chauhan et al. | |
| 2015/0102502 A1 | 4/2015 | Chiu et al. | |
| 2015/0194375 A1 | 7/2015 | Gowda et al. | |
| 2015/0255418 A1 | 9/2015 | Gowda et al. | |
| 2015/0255432 A1* | 9/2015 | Lin | H01L 21/565 257/774 |
| 2016/0093525 A1* | 3/2016 | Cook | H01L 21/4867 257/676 |
| 2016/0093597 A1* | 3/2016 | Chang | H01L 21/4853 257/737 |
| 2016/0104666 A1 | 4/2016 | Gowda et al. | |
| 2016/0218049 A1* | 7/2016 | Lin | H01L 24/97 |
| 2016/0276311 A1* | 9/2016 | Meyer | H01L 21/568 |
| 2017/0047266 A1* | 2/2017 | Ihara | H01L 23/3675 |
| 2017/0092567 A1 | 3/2017 | Vincent et al. | |
| 2017/0117200 A1 | 4/2017 | Kim et al. | |
| 2017/0141045 A1* | 5/2017 | Kim | H01L 23/552 |
| 2017/0141053 A1* | 5/2017 | Chen | H01L 21/565 |
| 2017/0154854 A1* | 6/2017 | Xiao | H01L 21/485 |
| 2017/0162523 A1 | 6/2017 | Hu | |
| 2017/0334714 A1* | 11/2017 | Gao | B81B 7/02 |
| 2018/0114745 A1* | 4/2018 | Oratti Kalandar | H01L 23/49568 |
| 2018/0190581 A1 | 7/2018 | Lin | |

OTHER PUBLICATIONS

Ozmat et al., "An Advanced Approach to Power Module Packaging," International Workshop on Integrated Power Packaging, Jul. 14-15, 2000, pp. 8-11.

Tentzeris et al., "3D-/Inkjet-Printed RF Packages and Modules for IoT Applications up to sub-THz frequencies," The 67th Electronic Components and Technology Conference, ECTC 2017, pp. 1-37.

Esfahani et al., "High Aspect Ratio Lithography for Litho-Defined Wire Bonding," 2014 Electronic Components & Technology Conference, pp. 1556-1561.

Tehrani et al., "Inkjet-Printed 3D Interconnects for Millimeter-Wave System-on-Package Solutions," 2016 IEEE, pp. 1-4.

(56) References Cited

OTHER PUBLICATIONS

Hedges et al., "3D Aerosol Jet Printing—Adding Electronics Functionality to RPRM," Optomec, DDMC 2012 Conference, Mar. 14-15, 2012, pp. 1-5.

Tuominen et al., "Component Embedding Platform for Thin Profile SiP, POP and Fan-Out WLP," 2015 17th Electronics Packaging Technology Conference, Dec. 2-4, 2015, pp. 1-6.

Fisher et al., "High Frequency, Low Cost, Power Packaging Using Thin Film Power Overlay Technology," Tenth Annual Applied Power Electronics Conference and Exposition, APEC '95, Mar. 5-9, 1995, pp. 12-17.

Fukui et al., "MEMS Manufacturing Solutions," 26th Annual Advanced Semiconductor Manufacturing Conference (ASMC), May 3-6, 2015, pp. 356-361.

Gdula et al., "An Overlay Interconnect Technology for 1GHz. and Above MCMs," IEEE Proceedings Multi-Chip Module Conference, MCMC '92, Mar. 18-20, 1992, pp. 171-174.

International Search Report and Written Opinion issued in connection with corresponding PCT Application No. PCT/US18/43060 dated Nov. 6, 2018.

International Search Report and Written Opinion issued in connection with corresponding PCT Application No. PCT/US18/43003 dated Nov. 7, 2018.

\* cited by examiner

ELECTRONICS PACKAGE INCLUDING INTEGRATED ELECTROMAGNETIC INTERFERENCE SHIELD AND METHOD OF MANUFACTURING THEREOF

BACKGROUND OF THE INVENTION

Embodiments of the invention relate generally to semiconductor device packages or electronics packages and, more particularly, to an electronics package that includes a conductive cap or shield formed on an insulating structure that surrounds an electrical component provided within the package. A miniaturized package topology is achieved by utilizing the sloped side walls of the insulating structure as a mounting structure for the conductive cap or shield.

State of the art electronics packaging covers a wide range of methods, structures, and approaches from wire bond modules to flip chip modules and to embedded chip modules. Wire bonded modules are a mature packaging approach that is low cost but has limited electrical performance. These modules use wires bonded to chip pads to connect the top I/O pads of power devices to an interconnect structure such as a metal-insulator-metal substrate such as ceramic, Aluminum Nitride (AlN), or Silicon Carbide (SiC) substrate with patterned metal on top and bottom. Wire bonds have inherently high inductance, generally high series resistance, current crowning on the bond pads, and microcracking within the semiconductor devices near bonding sites. An exemplary construction of a prior art wire bond electronics package 10 is illustrated in FIG. 1 with two power semiconductor devices 12 mounted onto a leadframe 14 using component attach material 16. Portions of the leadframe 14 extend beyond the molding resin 26 forming terminals 18. Wire bonds 20 connect die pads 22 located on the active surface 24 of semiconductor devices 12 to selected areas on the leadframe 14. Molding resin 26 encapsulates semiconductor devices 12, wire bonds 20, and exposed portions of leadframe 14. PowerRibbon© Bonding (K&S) is a modified version of power module wire bonding that replaces Al wire bonds with Al ribbons that use thermos-compression to bond to the chip pads. Beneficially, PowerRibbon© Bonding has lower resistance and therefore is targeted for higher current modules. However, PowerRibbon© Bonding has high inductance and can cause substrate microcracking.

Prior art flip chip modules experience reduced semiconductor substrate damage as compared to wire bond packages through the use of solder bumps, which have larger current carrying cross-sections than wire bonds. A general construction of a prior art flip chip electronic package 28 is illustrated in FIG. 2 with two semiconductor devices 12 attached to a top side metal layer 30 of substrate 32 by means of flip chip solder bumps 34. Thermal cooling is achieved with thermal connections 36 formed on the back side 38 of semiconductor devices 12. Molding resin 26 encapsulates the semiconductor devices 12, with portions of the top side metal layer 30 extending beyond the molding resin 26 forming terminals 18. While flip chip modules such as that illustrated in FIG. 2 provide some advantages over wire bond technology, the flip chip solder bumps have poor electrical conductivity, are susceptible to solder fatigue, are susceptible to electromigration and provide a very poor thermal cooling pathway.

Prior art embedded device modules, such as the embedded device module 40 illustrated in FIG. 3 fabricated using General Electric Company's power overlay (POL) technology, address many of the limitations of wire bond and flip chip packages by eliminating wire bonds and solder bumps and replacing them with direct metallization contacts. In the embedded device module 40, semiconductor devices 12 are mounted onto a dielectric film 42. A post connector 44 is also attached to the dielectric film 42 to provide a top-to-bottom electrical connection for the module 40. Microvias 46 are formed through the dielectric film 42 to the input/output (I/O) contact pads 22 of semiconductor devices 12 and to the post connector 44. A metallization layer 48 is applied to the outer surface of the dielectric film 42, the microvias 46 and the exposed pads 22 to form an electrical connection to the semiconductor devices 12. The dielectric film 42 with attached semiconductor devices 12 and post connector 44 is bonded to a power substrate 32 using an electrically conductive component attach material 50 such as solder. The gaps between semiconductor devices 12 and post connector 44 are filled with a molding resin 26. The embedded device module 40 has reduced parasitics (e.g., resistance, capacitance, and inductance) and a superior thermal performance as compared to wire bond modules or flip chip modules.

Despite the advantages of an embedded device module construction, POL technology is more complex, less mature, and higher cost than wire bond and flip chip approaches. Electrical connections within the module 40 are typically formed by either forming through holes in module 40 using laser drilling and hole metallization or by forming a via to an inserted I/O structure or frame adjacent to the device that provide vertical connections. These approaches increase the complexity and cost of the module and can increase the module footprint.

In any of the above-described prior art packaging topologies, it may be desired to shield a semiconductor device or module that is susceptible to electromagnetic emissions or electromagnetic interference ("EMI") from neighboring integrated circuit elements. Such EMI shielding may be accomplished through the use of an electrically conductive casing or housing that encloses and surrounds the exterior of the electrical package. While prior art EMI shielding housings or casings can be effective to reduce EMI, these structures also have a number of disadvantages, including increasing manufacturing complexity by incorporating additional steps in the form of adhering the housing or casing to the near-completed package structure and fabricating the electrical connections for grounding the housing or casing. These EMI housings or casings also increase package volume and pose a significant limitation to further miniaturization while maintaining or increasing performance.

Accordingly, it would be desirable to provide a new electronics packaging technology that permits construction of a highly miniaturized electronics package that includes shielding for the embedded electrical component. It would further be desirable that such new technology be capable of use for thermal management and grounding for the electronics package.

BRIEF DESCRIPTION OF THE INVENTION

In accordance with one aspect of the invention, an electronics package includes a support substrate, an electrical component having a first surface coupled to a first surface of the support substrate, and an insulating structure coupled to the first surface of the support substrate and sidewalls of the electrical component. The insulating structure has a sloped outer surface. A conductive layer encapsulates the electrical component and the sloped outer surface of the insulating structure. A first wiring layer is formed on a second surface of the support substrate. The first wiring layer is coupled to the conductive layer through at least one via in the support substrate.

In accordance with another aspect of the invention, an electronics package includes an electrical component having an active surface coupled to a first surface of a support substrate and an insulating structure disposed on the first surface of the support substrate and surrounding the electrical component. The electronics package also includes an electromagnetic interference (EMI) shield encapsulating a back surface of the electrical component and at least one sloped side wall of the insulating structure and covering at least a portion of the first surface of the support substrate surrounding the insulating structure. An insulating material encapsulates the EMI shield.

In accordance with another aspect of the invention, a method of forming an electronics package includes bonding an active surface of an electronic component to a first surface of a support substrate and encapsulating at least the sidewalls of the electronic component with a resin material to form an insulating structure having a sloped sidewall. The method also includes forming a conductive shield that encapsulates a back surface of the electrical component and the insulating structure and forming a first wiring layer extending through at least one via in the support structure to couple with the conductive shield.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings.

DETAILED DESCRIPTION

Figure 1:
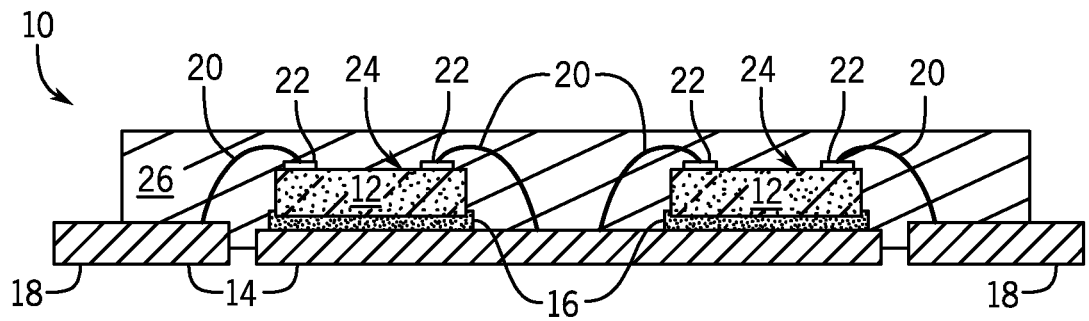
FIG. 1 is a schematic cross-sectional view of an exemplary prior art wire bond electronics package.
Figure 2:
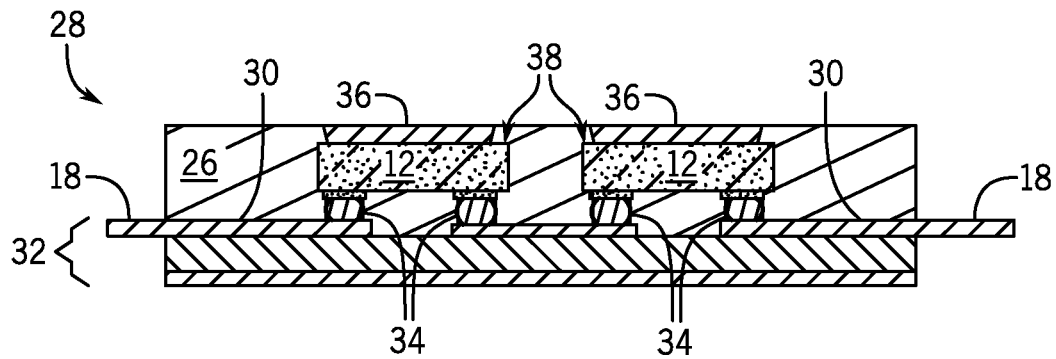
FIG. 2 is a schematic cross-sectional view of an exemplary prior art flip chip electronics package.
Figure 3:
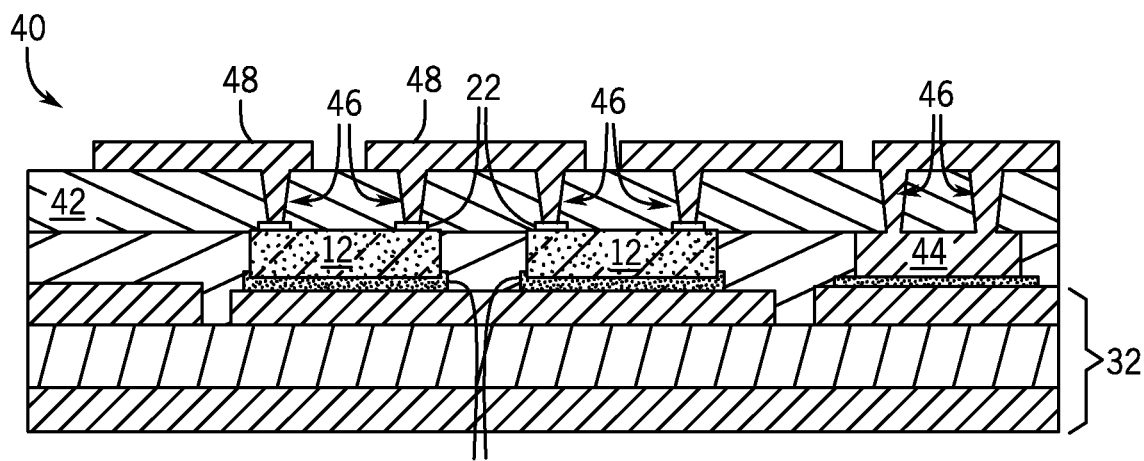
FIG. 3 is a schematic cross-sectional view of an exemplary prior art embedded chip electronics package.

Embodiments of the present invention provide for an electronics package or module that incorporates an electromagnetic interference (EMI) shield into an embedded electrical component in a manner that facilitates miniaturization of the overall electronics package and at the same time adds functionality to the "un-used" space on the backside of an embedded component. As described in detail below, this back side functionality is achieved by incorporating a localized insulating structure that at least partially surrounds the electrical component within the electronics package. The insulating structure is formed having sloped side walls that provide increased surface area on which a conductive layer of material is formed. This conductive layer provides back side functionality in the form of shielding, thermal dissipation, and/or grounding. The resulting electronics package can be surface mounted onto a substrate or placed within a multi-component module for complex circuits.

As used herein, the term "semiconductor device" refers to a semiconductor component, device, die or chip that perform specific functions such as a power transistor, power diode, analog amplifier, RF element, as non-limiting examples. Typical semiconductor devices include input/output (I/O) interconnections, referred to herein as contacts or contact pads, which are used to connect the semiconductor device to external circuitry and are electrically coupled to internal elements within the semiconductor device. The semiconductor devices described herein may be power semiconductor devices used as electrically controllable switches or rectifiers in power electronic circuits, such as switched mode power supplies, for example. Non-limiting examples of power semiconductor devices include insulated gate bipolar transistors (IGBTs), metal oxide semiconductor field effect transistors (MOSFETs), bipolar junction transistors (BJTs), integrated gate-commutated thyristors (IGCTs), gate turn-off (GTO) thyristors, Silicon Controlled Rectifiers (SCRs), diodes or other devices or combinations of devices including materials such as Silicon (Si), Silicon Carbide (SiC), Gallium Nitride (GaN), and Gallium Arsenide (GaAs). Semiconductor devices may also be digital logic devices, such as a microprocessor, microcontroller, memory device, video processor, or an Application Specific Integrated Circuit (ASIC), as non-limiting examples.

While the various embodiments of an electronics package referenced below are shown and described as including a particular arrangement of a semiconductor device, interconnection wiring and electronic package terminals, it is understood that alternative arrangements and configurations could also be implemented and thus embodiments of the invention are not limited only to the specifically illustrated devices and arrangements thereof. That is, the electronics package embodiments described below should also be understood to encompass electronic packages that might include additional electronic components and/or one or more alternative device types of semiconductor devices including acoustic devices, microwave devices, millimeter devices, RF communication devices, and micro-mechanical (MEMS) devices. The electronics packages described herein may also include one or more resistors, capacitors, inductors, filters and similar devices and combinations thereof. As used herein the terms "electrical component" or "electronic component" may be understand to encompass any of the various types of semiconductor devices described above in addition to resistors, capacitors, inductors, filters and similar passive devices, and energy storage components.

FIG. 4-9 illustrate electronics packages 52, 54, 56 according to alternative embodiments of the invention. Packages 52, 54, 56 include an electronic or electrical component such as a semiconductor device 58 as well as a number of similar components that are referenced with common part numbers as appropriate. While each package 52, 54, 56 is shown with only a single embedded semiconductor device 58, it is contemplated that alternative embodiments may include multiple semiconductor devices as well as one or more passive devices such as, for example, capacitors, resistors, and/or inductors.

Figure 4:
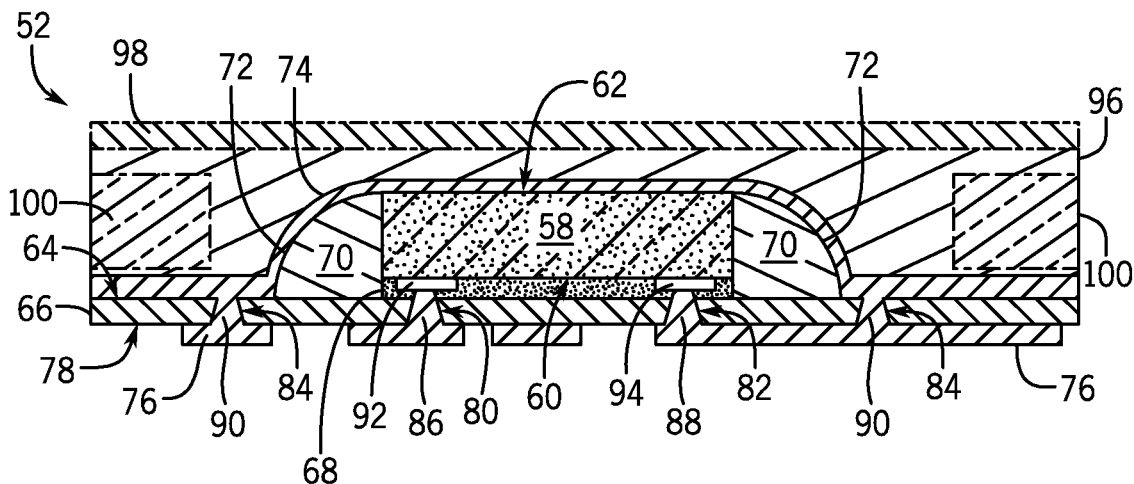
FIG. 4 is a schematic cross-sectional view of an electronics package, according to an embodiment of the invention.

Referring first to FIG. 4, electronics package 52 is illustrated according to one embodiment of the invention. Electronics package 52 includes an electrical component such as a semiconductor device 58 having an active surface 60 and a back surface 62 or back side surface. Active surface 60 is coupled to a first surface 64 of an insulating substrate 66 or support substrate using a component attach material 68. According to various embodiments, insulating substrate 66 may be provided in the form of an insulating film or dielectric substrate, such as for example a Kapton® laminate flex, although other suitable electrically insulating materials may also be employed, such as Ultem®, polytetrafluoroethylene (PTFE), or another polymer film, such as a liquid crystal polymer (LCP) or a polyimide substrate, as non-limiting examples. Component attach material 68 is an electrically insulating material that adheres to surrounding components of the electronics package 52 such as a polymeric material (e.g., epoxy, silicone, liquid crystal polymer, or a ceramic, silica, or metal filled polymer) or other organic material as non-limiting examples. In some embodiments, component attach material 68 is provided on insulating substrate 66 in either an uncured or partial cured (i.e., B-stage) form. Alternatively, component attach material 68 may be applied to semiconductor device 58 prior to placement on insulating substrate 66. In alternative embodiments, semiconductor device 58 may be affixed to insulating substrate 66 by way of an adhesive property of the insulating substrate 66 itself. In such an embodiment, component attach material 68 is omitted and insulating substrate 66 is provided in the form of a single dielectric layer having adhesive properties. Non-limiting examples of such an adhesive dielectric layer include a spin-on dielectric such as polyimide or polybenzoxzaole (PBO).

An insulating structure 70 with at least one tapered or sloped side surface or side wall 72 is coupled to the first surface 64 of insulating substrate 66. According to alternative embodiments, insulating structure 70 may be a cured photo-patternable resin, a polymer such as, for example, an epoxy material, a pre-preg material, a composite dielectric material, or any other electrically insulating organic or inorganic material. A conductive layer, cap, or conductive layer 74 is formed from a layer of electrically conductive material or metallization that is disposed on the outer surface or sloped side wall 72 of insulating structure 70, the back surface 62 of semiconductor device 58, and exposed portions of the first surface 64 of insulating substrate 66. The conductive layer 74 may be formed from aluminum, copper, gold, silver, nickel, or combinations thereof as non-limiting examples, or an electrically conductive polymer.

Figure 5:
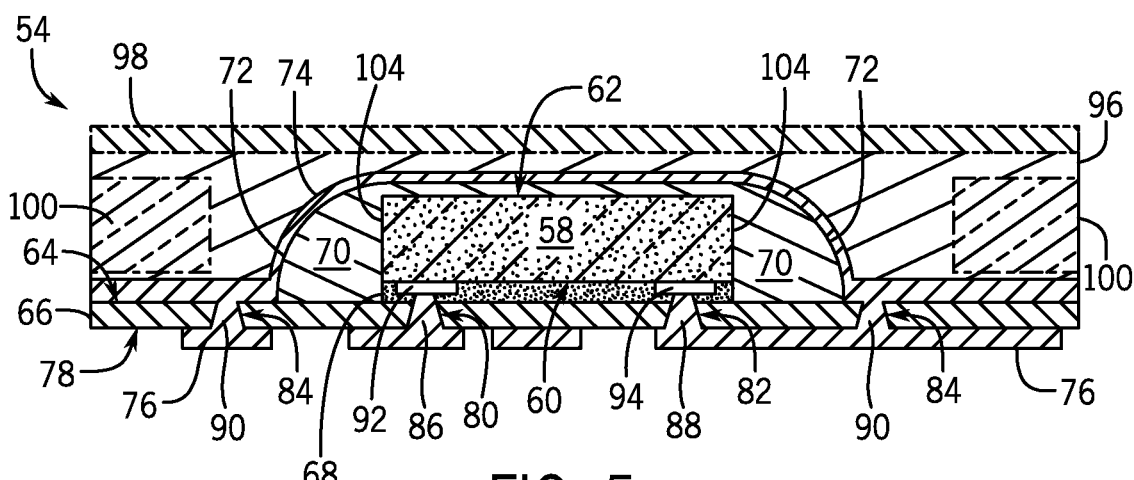
FIG. 5 is a schematic cross-sectional view of an electronics package, according to another embodiment of the invention.

The electronics package 54 of FIG. 5 differs from electronics package 52 in that the insulating structure 70 is formed to cover and encapsulate the back surface 62 of semiconductor device 58, as shown in FIG. 5. In this embodiment, the portion of insulating structure 70 between conductive layer 74 and back surface 62 electrically isolates the semiconductor device 58 from the conductive layer 74.

Referring now to FIGS. 4 and 5 together, a first wiring layer 76 or metallization layer is disposed on a second surface 78 of insulating substrate 66 and into vias 80, 82, 84 formed through insulating substrate 66. Penetrating contacts 86, 88, 90 are formed, which electrically couple the first wiring layer 76 to contact pads 92, 94 located on the active surface 60 of semiconductor device 58 and to conductive layer 74, respectively. Contact pads 92, 94 provide conductive routes (I/O connections) to internal contacts within semiconductor device 58. Contact pads 92, 94 may have a composition that includes a variety of electrically conductive materials such as aluminum, copper, gold, silver, nickel, or combinations thereof as non-limiting examples. While illustrated as structures that protrude outward from the active surface 60 of semiconductor device 56, contact pads 92, 94 may also be contact terminals located substantially flush or level with the active surface 60 of semiconductor device 58.

An electrically insulating material 96 overlays semiconductor device 58, insulating structure 70, conductive layer 74, and exposed portions of the first surface 64 of insulating substrate 66. Insulating material 96 may encapsulate all of semiconductor device 58 or portions thereof, in alternative embodiments.

In some embodiments electronics packages 52, 54 also include an optional second insulating substrate 98 (shown in phantom) provided atop the insulating material 96 and/or an optional support structure or a core structure 100 (shown in phantom) that provides additional dimensional stability to electronics package 52, 54. Insulating substrate 98 may be formed from any of the same materials as insulating substrate 66. Core structure 100 may be a printed circuit board (PCB) core material, such as, for example, an epoxy material with a fiberglass mat, a pre-preg material, polyimide film/layer, a ceramic material, glass, aluminum, a composite dielectric material, or other similar/suitable organic material or inorganic material that provides mechanical robustness to electronics package 52, 54.

Figure 6:
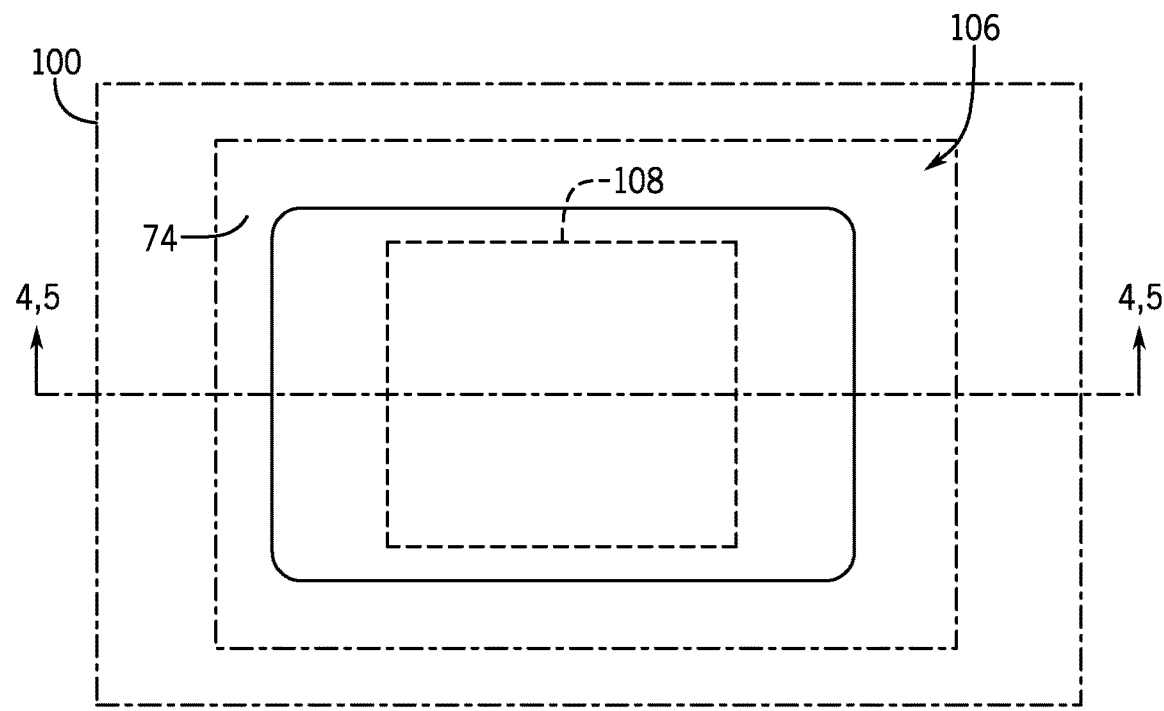
FIG. 6 is a topside view of the electronics packages of FIGS. 4 and 5, with the insulating material omitted according to one embodiment of the invention.

A topside view of electronics packages 52, 54 is provided in FIG. 6, with the insulating material 96 omitted for purposes of clarity to illustrate that conductive layer 74 is formed as a continuous layer of material that covers and encapsulates the back surface 62 of the semiconductor device 58, sloped side walls 72 of the insulating structure 70, and portions of the first surface 64 of the insulating substrate 66 adjacent the insulating structure 70.

Figure 7:
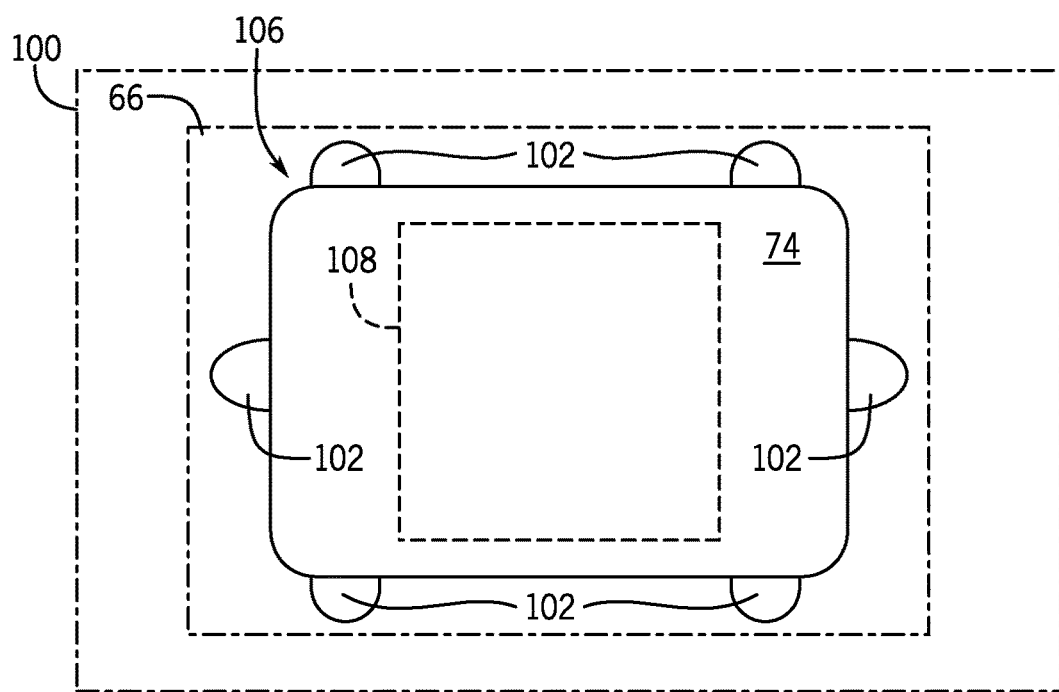
FIG. 7 is a topside view of an electronics package with the insulating material omitted according to an alternative embodiment of the invention.

FIG. 7 is a topside view of electronics packages 52, 54 according to an alternative embodiment, again with the insulating material 96 omitted. Similar to the embodiment illustrated in FIG. 6, conductive layer 74 is a continuous layer of conductive material that covers and encapsulates the back surface 62 of the semiconductor device 58 and the tapered or sloped side walls 72 of the insulating structure 70. In this embodiment, the portion of conductive layer 74 that extends onto the first surface 64 of insulating substrate 66 forms one or more terminal pads 102 that is electrically coupled to the remainder of conductive layer 74 that encapsulates the insulating structure 70.

The views provided in FIGS. 4-7 are to be understood as illustrating only two of numerous configurations of conductive layer 74 and insulating structure 70. In alternative embodiments, conductive layer 74 may include one or more patterned conductive lines (not shown) positioned outside the contact location of semiconductor device 58, which are provided in addition to or in place of the terminal pads 102 of FIG. 7. Insulating structure 70 may also be formed having alternative geometries than that shown—for example, having a generally oval, square, or rectangular shape that encapsulates the side walls 104 of semiconductor device 58. In yet other embodiments, insulating structure 70 may be formed to only partially surround one or more of the side walls 104 of semiconductor device 58.

As shown in FIGS. 6 and 7, optional core structure 100 includes an opening 106 that surrounds the outer perimeter 108 of semiconductor device 58 and insulating structure 70. Opening 106 may be formed for example by mechanical punch, laser cutting, water jet, or mechanical milling. Insulating material 96 fills the gaps between core structure 100 and insulating substrate 66 and covers conductive layer 74. It is contemplated that core structure 100 and/or second insulating substrate 98 may be incorporated into any of the other embodiments of an electronics package described herein in a similar manner. While not illustrated in FIG. 6, in embodiments where core structure 100 is a printed circuit board, it is contemplated that first wiring layer 76 may extend through additional microvias in insulating material 96 and in insulating substrate 66 to electrically couple with contact locations on the bottom and/or top surfaces core structure 100. In such an embodiment, a bonding layer (not shown) would be incorporated to couple the insulating substrate 66 to core structure 100.

Figure 8:
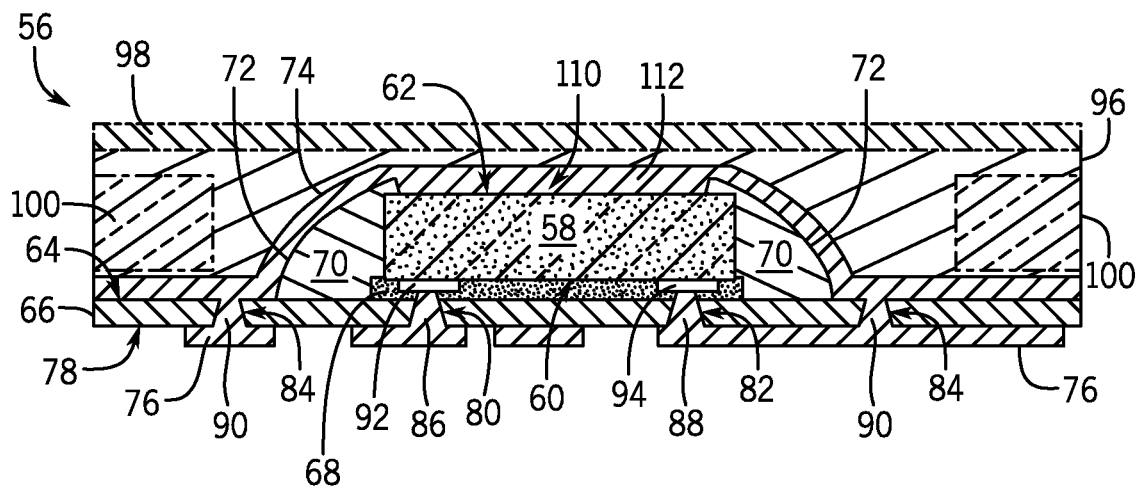
FIG. 8 a schematic cross-sectional view of an electronics package, according to another embodiment of the invention.
Figure 9:
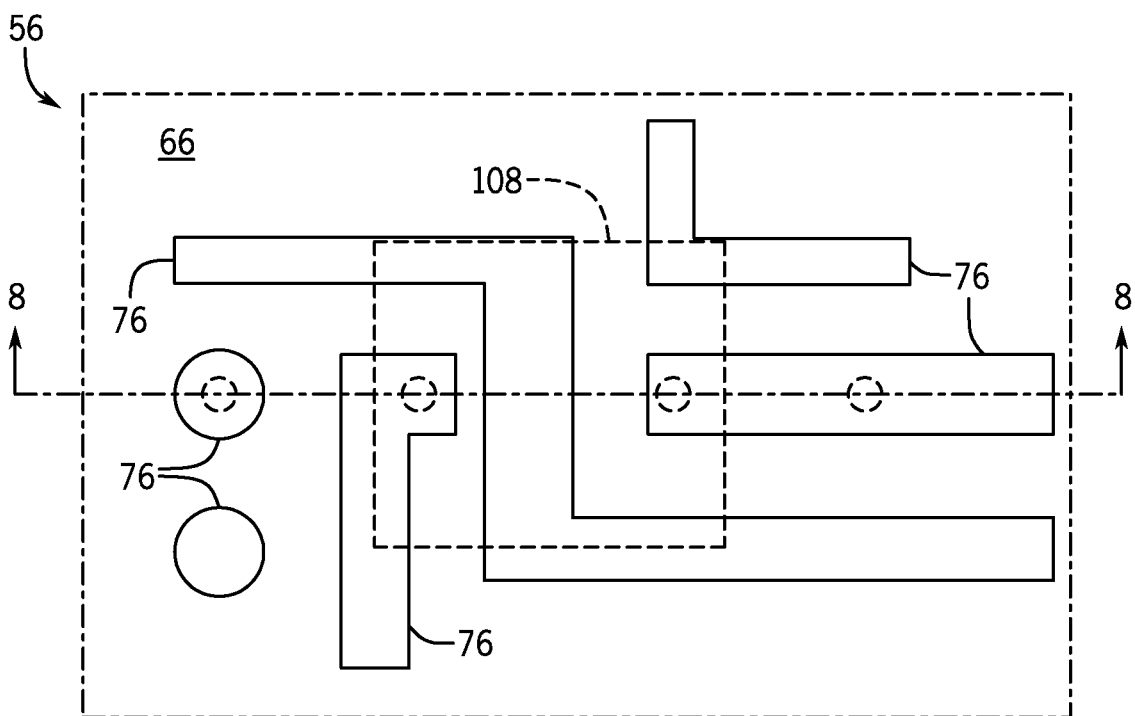
FIG. 9 is a bottom view of the electronics package of FIG. 8, according to one embodiment of the invention.

Referring now to FIGS. 8 and 9, electronics package 56 is illustrated according to another embodiment of the invention. Similar to electronics package 52, the semiconductor device 58 of electronics package 56 is mounted on insulating substrate 66 with its active surface 60 joined to insulating substrate 66 with a component attach material 68. The insulating structure 70 provided in electronics package 56 differs from that of electronics package 52 by extending over a portion of the back surface 62 of semiconductor device 58. The conductive material that forms layer 74 extends through a large via 110 in the insulating structure 70 to create a large contact 112 coupled to the back surface 62 of the semiconductor device 58. According to alternative embodiments, contact 112 may function to aid in heat transfer from semiconductor device 58 and/or provide a ground connection thereto, such as in embodiments where semiconductor device 58 does not include a back surface passivation. More specifically, connection to the backside surface 62 of the semiconductor device 58 through contact 112 may be beneficial in comparison to the direct physical contact of the FIG. 4 embodiment in order to ensure that the sidewalls 53 of the semiconductor device 58 remain electrically isolated from the conductive layer 74.

Conductive layer 74 then extends down the sloped side wall 72 of the insulating structure 70 and onto the first surface 64 of the insulating substrate 66. As compared to electronics package 52 (FIG. 4), the inclusion of contact 112 may provide a more reliable ground and/or thermal connection to the back surface 62 of semiconductor device 58. One skilled in the art will understand that any of the electronics packages disclosed herein may include a grounding contact similar to element 112 of FIG. 8 based on the design specifications of the particular electronics package.

First wiring layer 76 is formed on the second surface 78 of insulating substrate 66 and creates penetrating contacts 86, 88, 90 within vias 80, 82, 84. Similar to electronics package 52, penetrating contacts 86, 88 couple first wiring layer 76 to contact pads 92, 94 of semiconductor device 58. First wiring layer 76 is coupled to conductive layer 74 by way of penetrating contacts 90. A bottom side view of the electronics package 56 is illustrated in FIG. 9 to show one exemplary and non-limiting configuration of first wiring layer 76. One skilled in the art will recognize that the first wiring layer 76 may be similarly configured having a number of different traces in any of the other embodiments of the electronics packages disclosed herein. The first wiring layer 76 of electronics packages 52, 54 may be configured in a similar manner as illustrated in FIG. 9 or patterned having any number of alternative designs to achieve desired I/O connections according to alternative embodiments.

In one embodiment of electronics packages 52, 54, 56, the back surface 62 of semiconductor device 58 does not include any contact pads or other functionality. As such, the conductive layer 74 may serve a number of functions, including providing a thermal pathway to dissipate heat away from the semiconductor device 58, providing a ground connection for the semiconductor device 58, and/or forming an electromagnetic interference (EMI) shield that surrounds and encapsulates the semiconductor device 58. Where the conductive layer 74 provides EMI shielding, conductive layer 74 may either be formed directly on the back surface 62 of semiconductor device 58, as shown in FIG. 4, or be offset from the back surface 62 of semiconductor device 58 in embodiments where the insulating structure 70 covers and encapsulates the back surface 62 of semiconductor device 58 (as shown in FIGS. 5 and 8).

Figure 10:
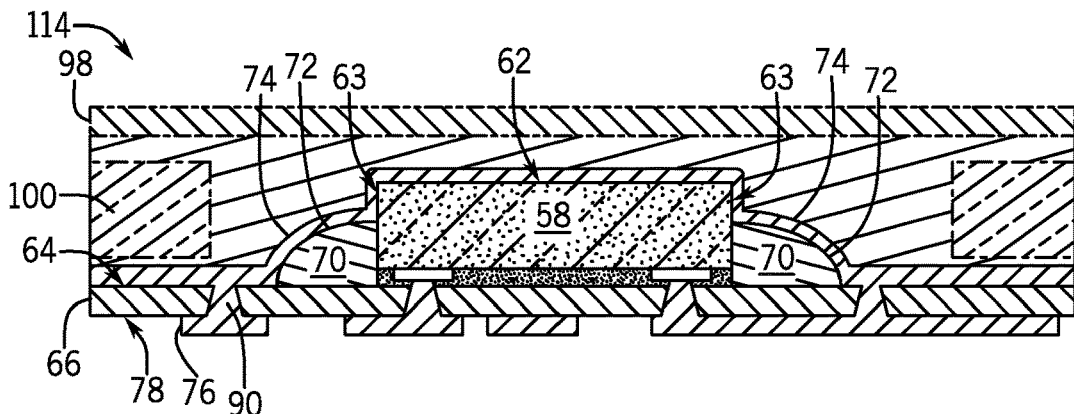
FIG. 10 is a schematic cross-sectional view of an electronics package, according to another embodiment of the invention.

An alternative embodiment of an electronics package 114 is illustrated in FIG. 10. Components common to electronics package 114 and electronics packages 52, 54 (FIGS. 4, 5) are referred to with common numbering. Electronics package 114 differs from electronics package 52 (FIG. 4) in that the insulating structure 70 is formed having a height 71 shorter than the height 73 of the semiconductor device 58. The reduced height of insulating structure 70 reduces material costs while still providing an increased surface area on which to form conductive layer 74. Conductive layer 74 is disposed directly on the back surface 62 of semiconductor device 58 and extends down a portion of the side surfaces 63 of the device 58 before transitioning onto the sloped side wall 72 of insulating structure 70. Conductive layer 74 then covers at least a portion of the top surface 64 of the insulating substrate 66. Optionally, a passivation layer (not shown) may be formed on the backside surface 62 and side surfaces 63 of the semiconductor device 58 to prevent shorting between the semiconductor device 58 and the conductive layer 74. Optional core structure 100 and second insulating substrate 98, both shown in phantom, may be incorporated within electronics package 114.

Figure 11:
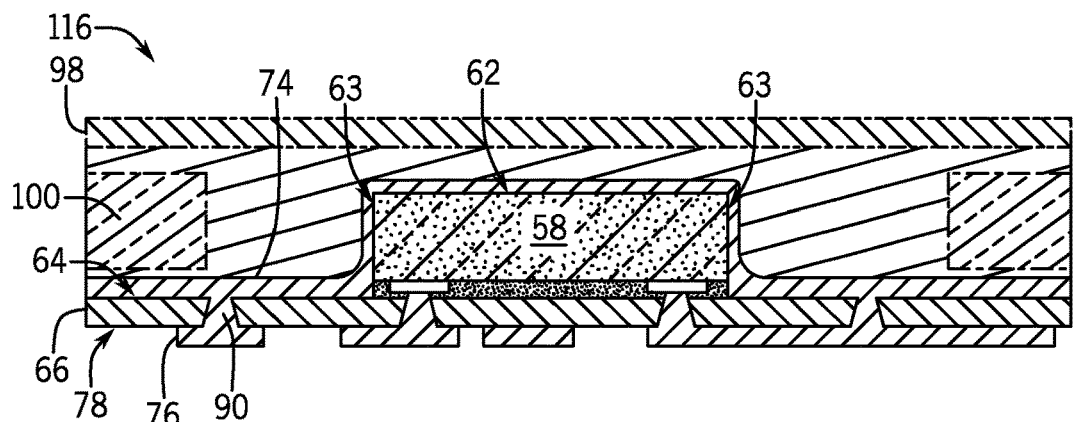
FIG. 11 is a schematic cross-sectional view of an electronics package, according to yet another embodiment of the invention.

Another alternative embodiment of an electronics package 116 is illustrated in FIG. 11, which differs from electronics package 52 (FIG. 4) and electronics package 114 (FIG. 10) in that insulating structure 70 is omitted entirely. The remaining components of electronics package 116 are similar to those previously described with respect to electronics package 52 and are referred to with common part numbers. In electronics package 116, conductive layer 74 is formed such that it covers the backside surface 62 and side surfaces 63 of semiconductor device 58 and extends across the top surface 64 of insulating substrate 66, thereby encapsulating semiconductor device 58. As in electronics package 114 (FIG. 10), the semiconductor device 58 included in electronics package 116 may include an optional passivation layer (not shown) covering the backside surface 62 and side surfaces 63 of the semiconductor device 58.

Figure 12:
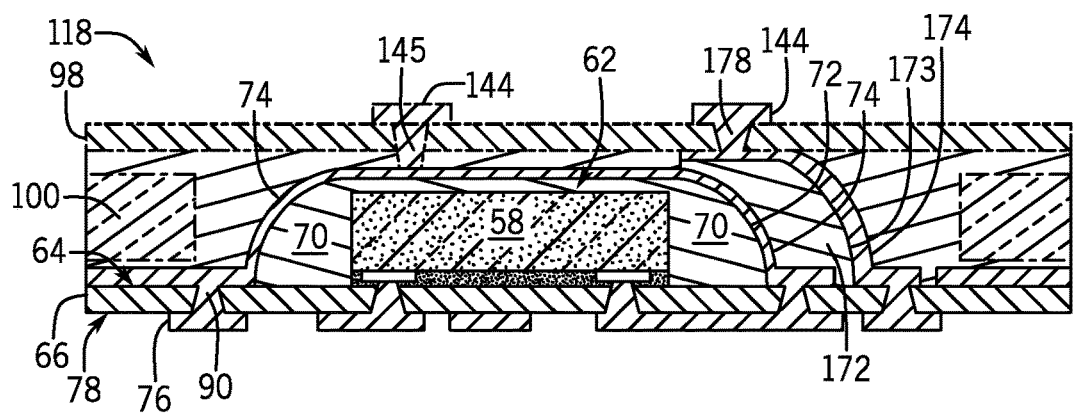
FIG. 12 is a schematic cross-sectional view of an electronics package, according to yet another embodiment of the invention.

Yet another alternative embodiment of an electronics package 118 is illustrated in FIG. 12. Electronics package 118 includes similar components as previously described with respect to electronics package 54 (FIG. 5), with insulating structure 70 being formed to cover the backside surface 62 of semiconductor device 58. In addition to the components common to electronics package 54, electronics package 118 further includes a second insulating structure 172 that is formed atop at least a portion of the insulating structure 70. The second insulating structure 172 may be formed using any of the same materials and techniques described herein with respect to insulating structure 70. Second insulating structure 172 may be formed at one or more discrete locations atop insulating structure 70, or may completely surround insulating structure 70 in alternative embodiments.

A wiring layer 174 is formed on the sloped surface 173 of second insulating structure 172 using any of the same materials and techniques as described with respect to wiring layer 76. Wiring layer 174 is electrically coupled to wiring layer 76 by way of a penetrating contact 176 that extends through insulating substrate 66. Another penetrating contact 178 extends through second insulating substrate 98 to similarly electrically couple wiring layer 174 to a second wiring layer 144, which may be formed on the second insulating substrate 98 using any of the same materials and techniques as described herein with respect to wiring layer 76. In one embodiment, wiring layer 174 is patterned to include a series of electrical routing paths or traces that for electrical connections to various locations within the electronics package 118.

Optionally, electronics package 118 may further include one or more penetrating contacts 145 (shown in phantom) that extend through the second insulating substrate 98 and the insulating material 96 to electrically couple a portion of the second wiring layer 144 to the conductive layer 74. It is contemplated that a wiring layer 144 and penetrating contact(s) 145 may be included within any of the other electronics package embodiments described herein in a similar manner.

The "double-sloped" surface configuration resulting from the combination of insulating structures 70, 172 and their associated electrical connection layers 74, 174 may be incorporated into any of the other electronic package embodiments described herein. Additionally, it is contemplated that the double-sloped surface configuration may be extended to include three or more layers of insulating substrate/wiring layer stackups.

Referring now to FIGS. 13-21, a technique for manufacturing the electronics package electronics package 52 of FIG. 4 is set forth, according to one embodiment of the invention, with each figure illustrating a cross-section of the electronics package 52 during the build-up process. One skilled in the art will recognize that minor modifications to the steps described herein may be made to manufacture electronics packages 54, 56, 114, 116, 118 or variations thereof. While FIGS. 13-21 illustrate the manufacture of a single electronics package, one skilled in the art will recognize that multiple electronics packages could be manufactured in a similar manner at the panel level and then singulated into individual electronics packages as desired.

Figure 13:
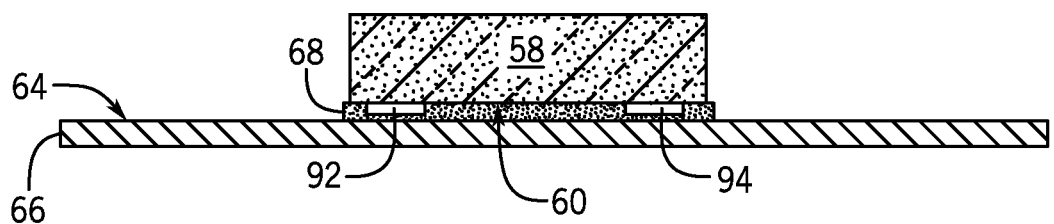
FIGS. 13-21 are schematic cross-sectional side views of the electronics package of FIG. 4 during various stages of a manufacturing/build-up process, according to an embodiment of the invention.
Figure 22:
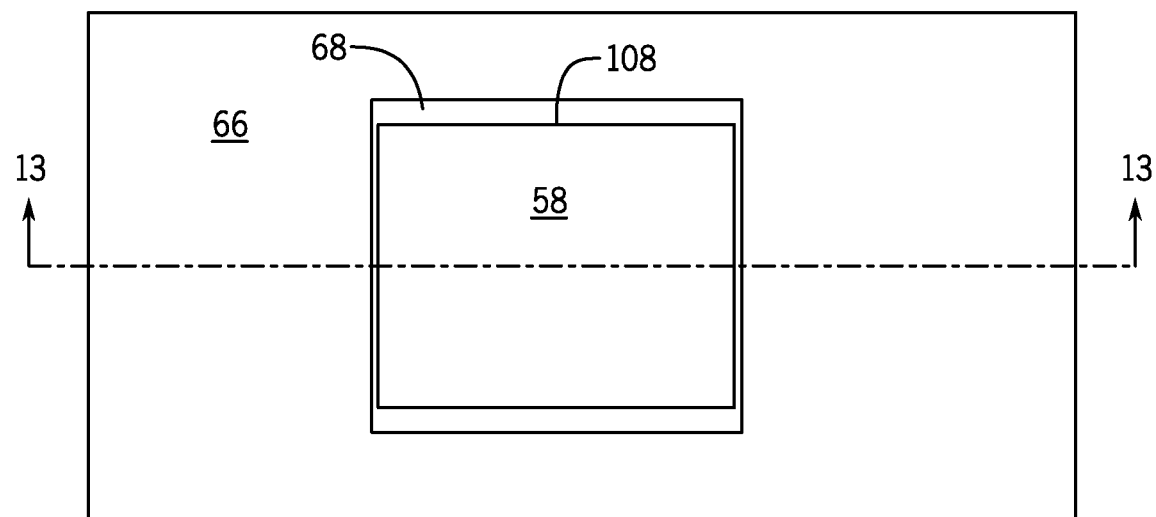
FIGS. 22 and 23 are schematic top views of the electronics package of FIG. 4 during select stages of the manufacturing/build-up process illustrated in FIGS. 13-21.

Referring first to FIG. 13, fabrication of electronics package 52 begins by applying component attach material 68 to the first surface 64 of insulating substrate 66. Component attach material 68 is applied to coat component attach locations, and in some embodiments extends outside the outer perimeter 108 of the semiconductor device 58, as shown in FIG. 22. In some embodiments, the component attach material 68 may be applied by stencil, screen printing, or using a direct dispense technique such as ink jetting, for example. Component attach material 68 may have a thickness in the range of 2 to 50 in one exemplary and non-limiting embodiment. In alternative embodiments, component attach material 68 may be applied to coat the entirety of exposed surfaces of insulating substrate 66, applied to semiconductor device 58 prior to positioning semiconductor device 58 on insulating substrate 66, may be provided having a thickness outside the previously stated range, or omitted entirely in cases where insulating substrate 66 has adhesive properties.

Semiconductor device 58 is placed active surface 60 face down into the component attach material 68 using conventional pick and place equipment and methods. After being positioned, the semiconductor device 58 is bonded to insulating substrate 66 by fully curing component attach material 68 using heat, UV light, or microwave radiation, as examples. In one embodiment, a partial vacuum and/or above atmospheric pressure may be used to promote the removal of volatiles from the adhesive during cure if any are present.

Figure 14:
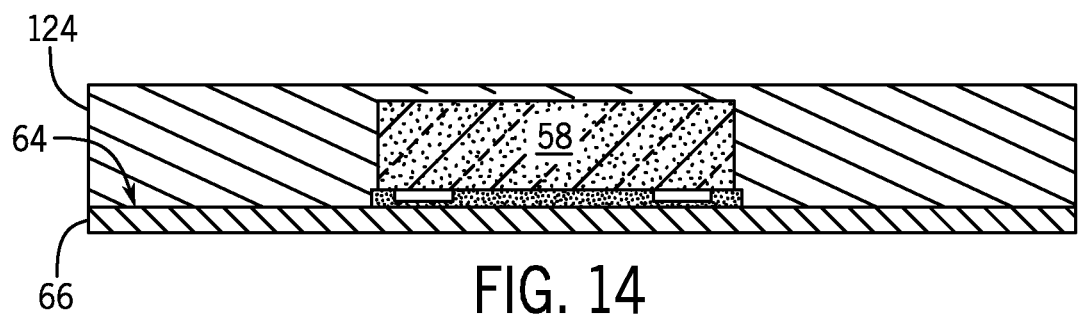
Figure 15:
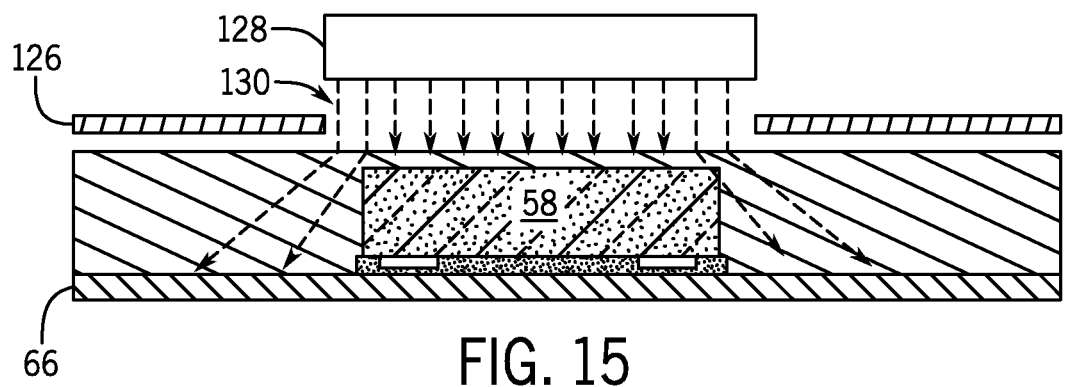
Figure 16:
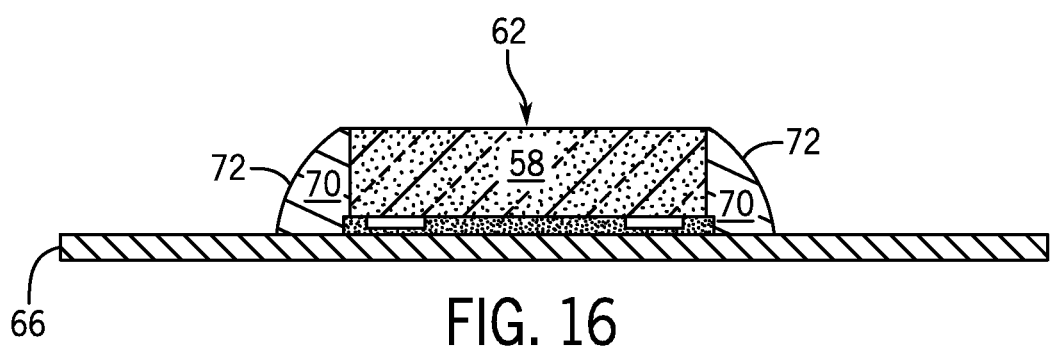
Figure 23:
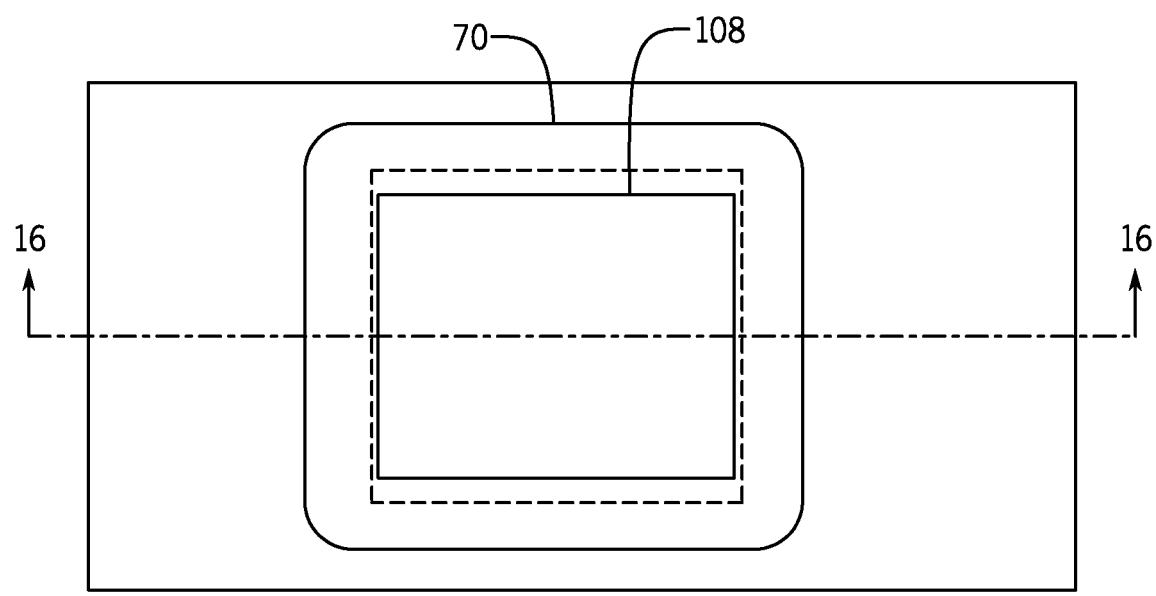

In a next step of the fabrication technique shown in FIG. 14, insulating structure 70 is formed by applying a layer of photo-patternable resin material 124 over the entire semiconductor device 58 and to coat the first surface 64 of insulating substrate 66 fully encapsulating semiconductor device 58. A photo-patterning mask 126 is placed over the top surface of the photo-patternable resin material 124 as shown in FIG. 15. The photo-patternable resin material 124 is then patterned by radiating a beam of unfocused light emitted by a light source 128 through one or more openings 130 in the mask 126. The width of the beam of light will expand as it extends into the photo-patternable resin material 124 and selectively cure regions of the photo-patternable resin material 124 below the opening 130. A solvent rinse is used thereafter to remove uncured photo-patternable resin material 124. Cured resin material is then removed from the back surface 62 of semiconductor device 58 and the backside contact pad(s) 116 provided thereon, leaving the cured insulating structure 70 illustrated in FIG. 16. As shown in the top view provided in FIG. 23, the insulating structure 70 surrounds the outer perimeter 108 of semiconductor device 58. In alternative embodiments, insulating structure 70 may be formed to only partially surround the outer perimeter 108 of semiconductor device 58. In yet another embodiment, the insulating structure 70 may be patterned by a direct write imaging system such as a laser. Alternatively, insulating structure 70 may be formed using a grey scale mask.

In alternative embodiments, insulating structure 70 is formed by applying an insulating resin to at least one of the edges of the outer perimeter 108 of semiconductor device 58. This insulating resin may be, for example, an organic underfill resin or epoxy with filler material such as, for example, ceramic or silica filler particles, to reduce its coefficient of thermal expansion. Deposition of the insulating resin can be accomplished using a direct dispense tool such as an ink jet printer, a spray system, a 3D printing technique, or a liquid dispense head, as non-limiting embodiments. Thereafter, the resin material is cured using heat, UV light, microwaves, or the like. Optionally, the insulating resin can be applied to form a layer of material coating the insulating substrate 66 and/or the active surface 60 of semiconductor device 58 and selectively patterned to remove select portions of the applied insulating resin on the insulating substrate 66 and/or the active surface 60 of semiconductor device 58 to yield the insulating structure 70 illustrated in FIG. 16. Alternatively, the insulating resin could be locally dispensed around the perimeter 108 of semiconductor device 58, without covering the entire surface of insulating substrate 66.

Figure 17:
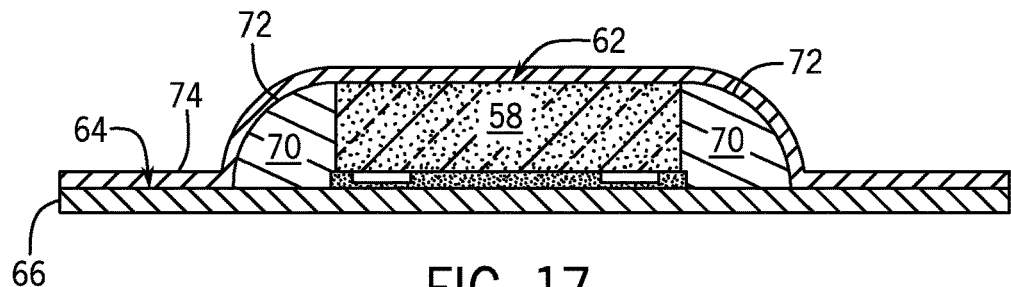

After forming insulating structure 70, conductive layer 74 is formed by applying a continuous layer of conductive material on the sloped side walls 72 of insulating structure 70, the back surface 62 of semiconductor device 58, and exposed regions of the first surface 64 of insulating substrate 66 as shown in FIG. 17. According to alternative embodiments, the conductive layer 74 is a metallization layer formed from a metal such as copper, aluminum, or other standard wiring metal, may contain a barrier metal such as titanium, and is deposited by one or more of sputtering, evaporation, electroless plating, electroplating, or other standard metal deposition processes.

In one embodiment, conductive layer 74 covers the entire expose surface of insulating substrate 66. In other embodiments, portions of the conductive material located on the surface 64 of insulating substrate 66 surrounding the insulating structure 70 may be removed via a patterning technique, while retaining a continuous layer of metallization over the semiconductor device 58 and the insulating structure 70. In one embodiment, the patterning step may be carried out using a semi-additive patterning technique wherein a first seed metal or barrier metal (e.g., titanium) is applied to the sloped side walls 72 of insulating structure 70 and the exposed regions of the first surface 64 of insulating substrate 66. A photo-resist (not shown) is applied to the seed metal and patterned, a layer of bulk metal (e.g., copper) is plated up atop the seed or barrier metal. The barrier layer can have a thickness of 0.01 to 1 micron and the bulk metal can have a thickness of 1 to 20 microns according to an exemplary, non-limiting embodiment. The photo-resist is removed and the exposed seed layer is removed by etching. The remaining seed metal and the plated up layer of metal form the conductive layer 74. In alternative embodiments conductive layer 74 may be formed using other known patterning techniques such as, for example, fully subtractive patterning, semi-additive pattern plate-up, or additive plate-up. In yet other embodiments conductive layer 74 could also be printed with conductive pastes, or laser activated and then selectively plated.

Figure 18:
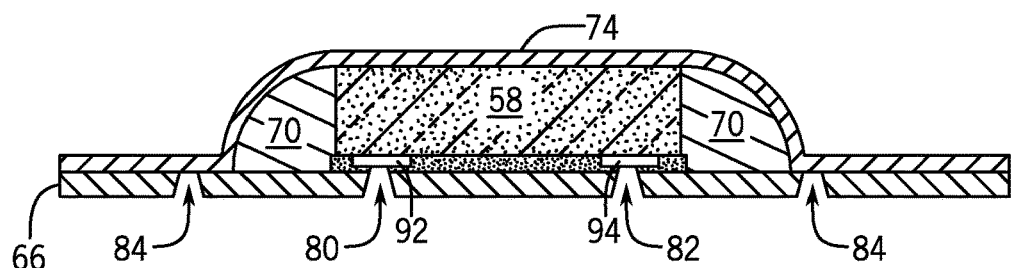
Figure 19:
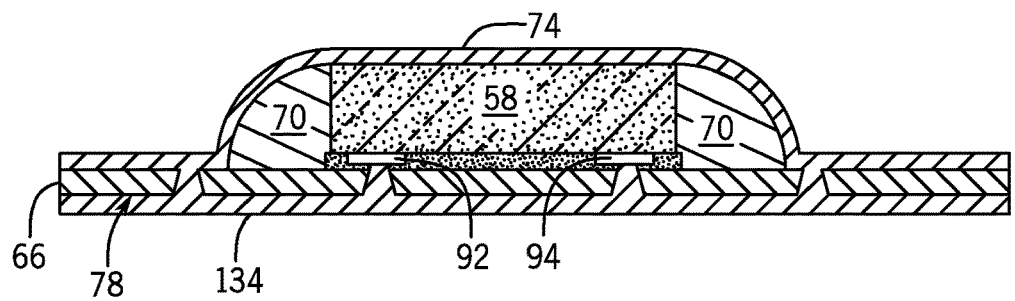
Figure 20:
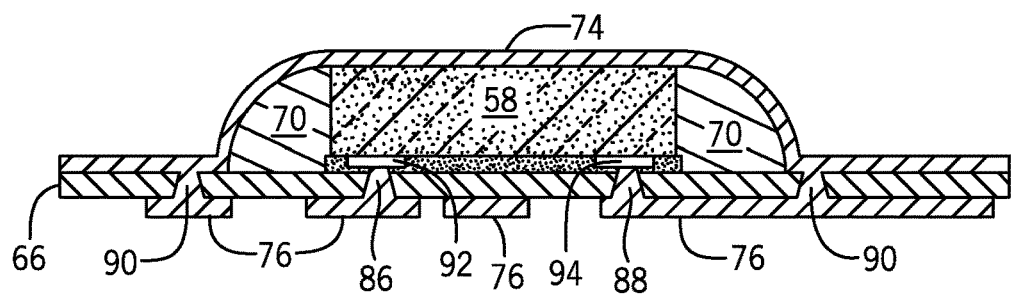

Referring next to FIG. 18, vias 80, 82, 84 are formed through insulating substrate 66 to select areas of conductive layer 74 and to contact pads 92, 94 of semiconductor device 58 by known standard microvia processes, including laser drilling or ablation, mechanical drilling, photo-definition, plasma etch, or chemical etch, and the like. After the vias 80, 82, 84 are formed, a second layer of conductive material 134 is deposited onto the second surface 78 of insulating substrate 66 as shown in FIG. 19. The layer of conductive material 134 is patterned thereafter to form first wiring layer 76 as shown in FIG. 20. Deposition and patterning may be carried out in a similar manner as described above for the layer of conductive material that is used to form conductive layer 74. This second layer of conductive material 134 extends into vias 80, 82, 84, thereby forming penetrating contacts 86, 88, 90.

Figure 21:
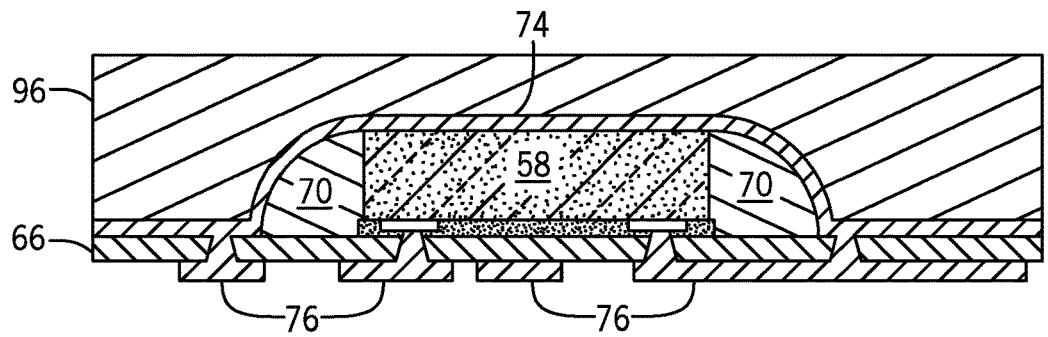

The manufacturing process continues in FIG. 21 by applying insulating material 96 over the back surface 62 of semiconductor device 58, conductive layer 74, exposed portions of insulating structure 70, and exposed portions of insulating substrate 66 to form a body for the electronics package 114. According to alternative and non-limiting embodiments, insulating material 96 may be applied using a pour molding, injection molding, or compression molding process. In embodiments that include optional core structure 100, the core structure 100 may be adhesively coupled to the first surface 64 of the insulating substrate 66 prior to applying the insulating material 96 in a similar manner as later described with respect to FIG. 27.

Figure 24:
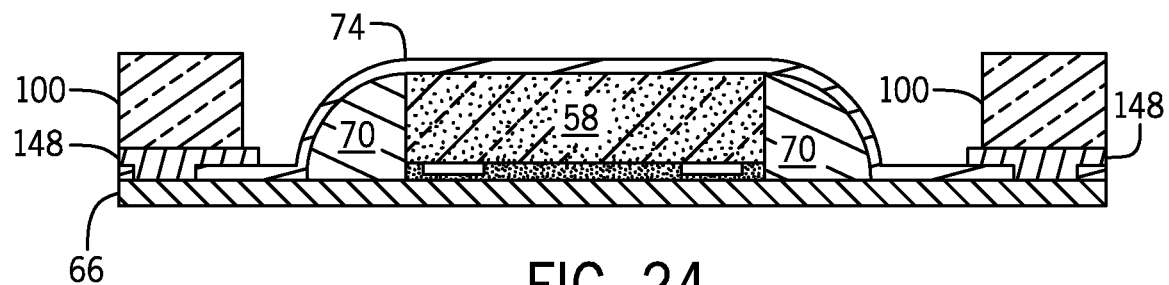
FIGS. 24-26 are schematic cross-sectional side views of select stages of a manufacturing/build-up process for an electronics package, according to an alternative embodiment of the invention.
Figure 25:
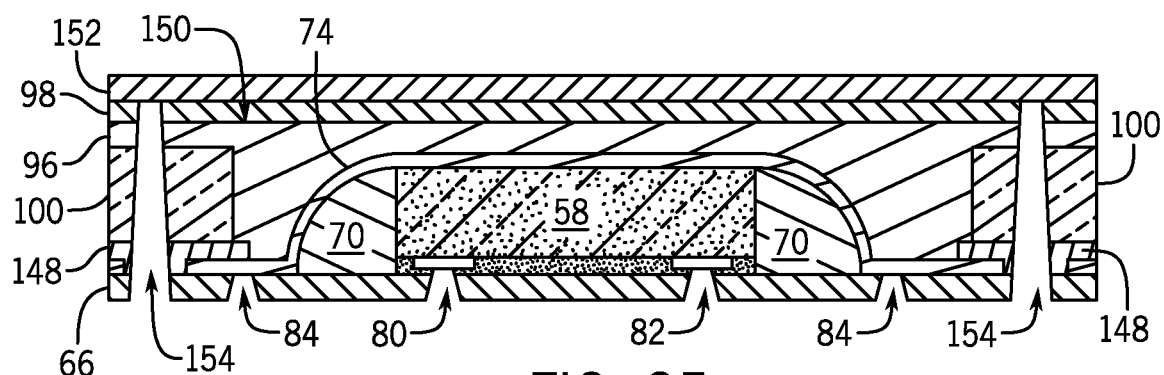
Figure 26:
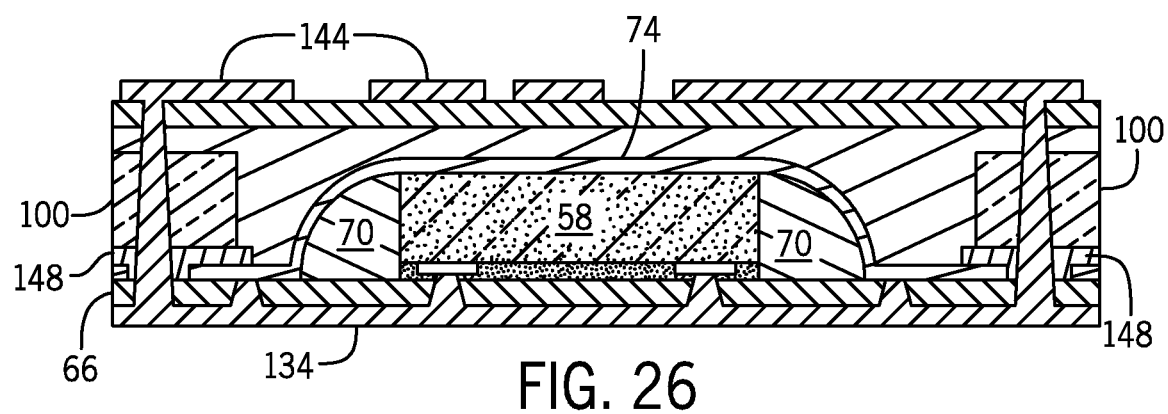

FIGS. 24-26 illustrate alternative manufacturing steps that may be utilized in conjunction with select portions of the manufacturing technique described above with respect to FIGS. 13-21 to fabricate a modified version of the electronics package 52 of FIG. 4. In the modified technique, manufacture beings by coupling semiconductor device 58 to insulating substrate 66, forming insulating structure 70, and forming conductive layer 74 in a similar manner as described with respect to FIGS. 13-17. In embodiments that include core structure 100, a joining material 148 is applied exposed portions of insulating substrate 66 and portions of functional layer 74 and used to couple them to core structure 100, as shown in FIG. 24. The manufacturing process continues in FIG. 25 by applying insulating material 96 to surround core structure 100, conductive layer 74, and any exposed portions of insulating substrate 66 using any of the techniques previously described with respect to FIG. 21.

After the insulating material 96 is cured, second insulating substrate 98 is coupled to the top surface 150 of insulating material 96 as shown in FIG. 25. Thereafter, a third layer of conductive material 152 is deposited on the second insulating substrate 98. Vias 80, 82, 84 and any through holes 154 are formed. The third layer of conductive material 152 is patterned to form the second wiring layer 144 shown in FIG. 26, and the second layer of conductive material is deposited onto the second surface 78 of insulating substrate 66 and into vias 80, 82, 84 and any through holes 154. The second layer of conductive material 134 is then patterned in a similar manner as described with respect to FIG. 20.

Figure 27:
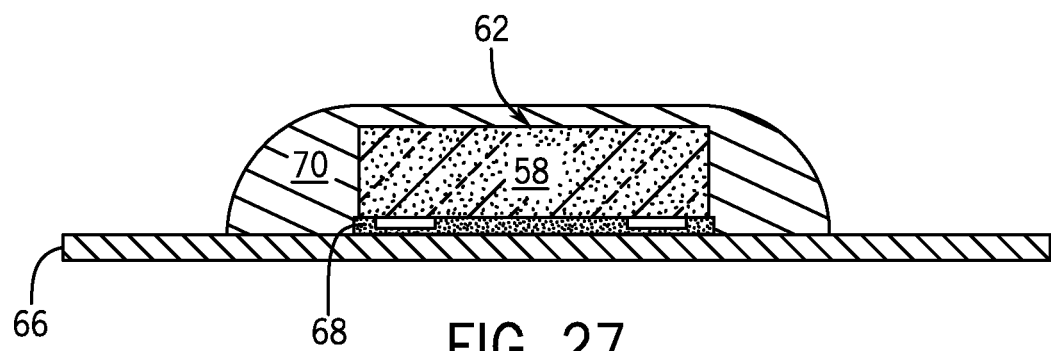
FIG. 27-29 are schematic cross-sectional side views of select stages of a manufacturing/build-up process for an electronics package, according to an alternative embodiment of the invention.
Figure 28:
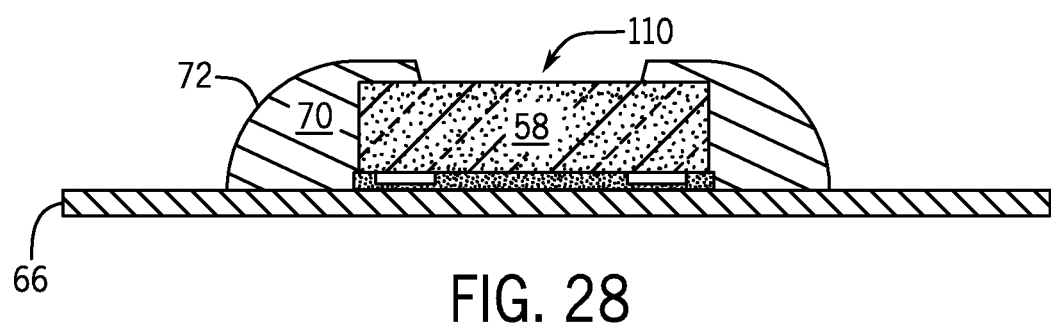
Figure 29:
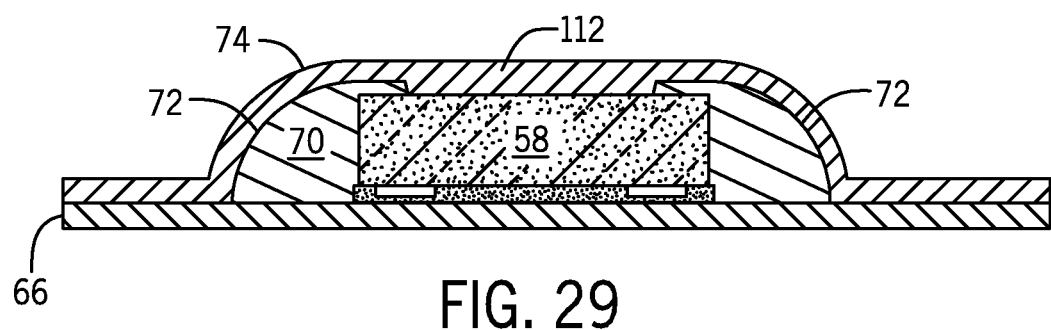

Referring now to FIGS. 27-29, in yet another alternative embodiment the above-described manufacturing process of FIGS. 13-21 may be modified to form the electronics package 58 of FIG. 8 including metalized via connections or contacts 112 to the backside surface 62 of semiconductor devices 58. In such an embodiment, manufacture would begin in a similar manner as described for FIGS. 13 and 14 by coupling semiconductor device 58 to insulating substrate 66 and applying a layer of photo-patternable resin material 124. Once cured, a portion of the insulating structure 70 would be retained to cover the backside surface 62 of semiconductor device 58, as shown in FIG. 27.

Referring to FIG. 28, one or more vias 110 are formed through the insulating structure 70 to the backside 62 of semiconductor device 58 using similar techniques as described above for vias 80, 82, 84. The conductive layer 74, shown in FIG. 29, is then formed by depositing and patterning a layer of conductive material on the sloped side walls 72 of insulating structure 70, into the one or more vias 110, and onto exposed backside 62 of semiconductor device 58 using any of the previously described techniques. Fabrication of the electronics package would then continue in accordance with the steps illustrated in FIGS. 18-21.

The order and sequence the process or method steps associated with the above-described manufacturing or build-up technique for electronics packages 52, 54, 56, 114, 116, 118 may be modified from that described herein while still arriving at an equivalent or substantially equivalent end structure. As one non-limiting example, in embodiments that include second insulating substrate 98, insulating material 96 may be applied using an underfill technique after the insulating substrate 98 is incorporated within the electronics package. Additionally, some or all of vias 80, 82, 84 may be formed before semiconductor device 58 is coupled to insulating substrate 66 and the formation and patterning of the first and second wiring layers may occur simultaneously or in the opposite order previously described herein.

In each of the electronics packages described herein, the conductive layer 74 is formed to extend along the sloped side walls 72 of the insulating structure 70 and form a cap over semiconductor device 58. Depending on the configuration of the electrical component(s) provided within the electronics package and whether the electrical component(s) include backside contact pads, the conductive layer 74 is constructed to provide thermal dissipation and/or shielding in a manner that involves fewer and less complex processing steps. By utilizing insulating structure 70 and, optionally, portions of the backside surface 62 of the semiconductor device 58 as the support surface(s) for the conductive layer 74, the overall size of the electronics package can be reduced as compared to that of prior art embedded device technology that incorporate external EMI shields or heat sinks.

Beneficially, embodiments of the invention thus provide for higher power handling and performance and smaller form factor compared to a prior art wire bonding package and higher thermal performance and lower costs compared to a prior art flip chip package. Embodiments of the invention disclosed herein also provide a lower cost, faster turn time process than existing prior art embedded power packages. Accordingly, the embodiments described herein provide a low cost solution with higher performance as compared to prior art approaches.

Therefore, according to one embodiment of the invention, an electronics package includes a support substrate, an electrical component having a first surface coupled to a first surface of the support substrate, and an insulating structure coupled to the first surface of the support substrate and sidewalls of the electrical component. The insulating structure has a sloped outer surface. A conductive layer encapsulates the electrical component and the sloped outer surface of the insulating structure. A first wiring layer is formed on a second surface of the support substrate. The first wiring layer is coupled to the conductive layer through at least one via in the support substrate.

According to another embodiment of the invention, an electronics package includes an electrical component having an active surface coupled to a first surface of a support substrate and an insulating structure disposed on the first surface of the support substrate and surrounding the electrical component. The electronics package also includes an electromagnetic interference (EMI) shield encapsulating a back surface of the electrical component and at least one sloped side wall of the insulating structure and covering at least a portion of the first surface of the support substrate surrounding the insulating structure. An insulating material encapsulates the EMI shield.

According to yet another embodiment of the invention, a method of forming an electronics package includes bonding an active surface of an electronic component to a first surface of a support substrate and encapsulating at least the sidewalls of the electronic component with a resin material to form an insulating structure having a sloped sidewall. The method also includes forming a conductive shield that encapsulates a back surface of the electrical component and the insulating structure and forming a first wiring layer extending through at least one via in the support structure to couple with the conductive shield.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. An electronics package comprising:
   a support substrate comprising a first surface and a second surface opposite the first surface;
   an electrical component having a first surface, a second surface opposite the first surface, and a plurality of side walls extending between the first and second surfaces, wherein the first surface is attached to the first surface of the support substrate;
   an insulating structure attached to the first surface of the support substrate and to the plurality of side walls of the electrical component, the insulating structure absent from a majority of an area between the electrical component and the support substrate and having a sloped outer surface;
   a conductive material encapsulating the electrical component and the sloped outer surface of the insulating structure; and
   a first wiring layer formed on the second surface of the support substrate, the first wiring layer coupled to the conductive material through at least one via in the support substrate.

2. The electronics package of claim 1 wherein the conductive material covers at least a portion of the first surface of the support substrate adjacent the insulating structure.

3. The electronics package of claim 1 wherein the insulating structure encapsulates a backside surface of the electrical component.

4. The electronics package of claim 3 wherein the conductive material extends through a via formed in the insulating structure to contact the backside surface of the electrical component.

5. The electronics package of claim 1 wherein the first surface of the electrical component comprises an active surface having at least one contact pad positioned thereon; and
   wherein the first wiring layer is coupled to the at least one contact pad through at least another via in the support substrate.

6. The electronics package of claim 1 further comprising an insulating material surrounding the electrical component, the insulating structure, and the conductive material.

7. The electronics package of claim 6 further comprising a support structure embedded within the insulating material.

8. The electronics package of claim 6 further comprising a second wiring layer electrically coupled to the first wiring layer by at least one electrical connection formed through a thickness of the electronics package; and wherein the first wiring layer forms a first input/output connection on a first side of the electronics package the second wiring layer forms a second input/output connection on a second side of the electronics package.

9. An electronics package comprising:
an electrical component having an active surface coupled to a first surface of a support substrate and a back surface opposite the active surface;
an insulating structure disposed on the first surface of the support substrate and surrounding the electrical component, the insulating structure absent from a majority of an area between the electrical component and the support substrate and having at least one sloped side wall;
an electromagnetic interference (EMI) shield encapsulating the back surface of the electrical component and the at least one sloped side wall of the insulating structure and covering at least a portion of the first surface of the support substrate surrounding the insulating structure; and
an insulating material encapsulating the EMI shield.

10. The electronics package of claim 9 further comprising a wiring layer extending through at least one via in the support substrate to couple with the EMI shield.

11. The electronics package of claim 10 wherein the wiring layer extends through at least one other via in the support substrate to electrically couple with at least one contact pad on the active surface of the electrical component.

12. The electronics package of claim 9 wherein the insulating structure completely surrounds an outer perimeter of the electrical component.

13. A method of forming an electronics package comprising:
bonding an active surface of an electronic component to a first surface of a support substrate;
encapsulating at least the sidewalls of the electronic component with a resin material to form an insulating structure having a sloped sidewall, wherein the resin material is absent from a majority of an area between the electronic component and the support substrate;
forming a conductive shield that encapsulates a back surface of the electronic component and the insulating structure; and
forming a first wiring layer extending through at least one via in the support substrate to couple with the conductive shield.

14. The method of claim 13 further comprising forming the first wiring layer to extend though at least another via in the support substrate to electrically couple with at least one contact pad located on the active surface of the electronic component.

15. The method of claim 14 further comprising forming the conductive shield to electrically couple the back surface of the electronic component to the first wiring layer.

16. The method of claim 13 further comprising surrounding the electronic component, the resin material, and the conductive shield with an insulating material.

17. The method of claim 16 further comprising forming a second wiring layer on a side of the electronics package opposite the first wiring layer; and
electrically coupling the second wiring layer to the first wiring layer with at least one electrical connection formed through a thickness of the electronics package.

18. The method of claim 13 wherein bonding of the electronic component comprises disposing a component attach material on one of a surface of the electronic component and the first surface of the support substrate.

19. The method of claim 13 comprising forming vias through the support substrate by one or more of laser drilling, mechanical drilling, plasma etching, and chemical etching.

20. The method of claim 13 wherein forming the first wiring layer extending through at least one comprises depositing and patterning a metal layer by one or more of sputtering, evaporation, electroless plating, and electro-plating.

21. The method of claim 13 wherein encapsulating at least the sidewalls of the electronic component with the resin material further comprises disposing a resin material around the electronic component and curing the resin material.

22. The method of claim 13 further comprising mounting a support structure on the first surface of the support substrate, the support structure having an opening sized to accommodate the electronic component.

* * * * *

UNITED STATES PATENT AND TRADEMARK OFFICE
CERTIFICATE OF CORRECTION

PATENT NO. : 10,541,209 B2  
APPLICATION NO. : 15/668553  
DATED : January 21, 2020  
INVENTOR(S) : Kapusta et al.

Page 1 of 1

It is certified that error appears in the above-identified patent and that said Letters Patent is hereby corrected as shown below:

In the Claims

Column 16, Line 32 (Claim 20), delete "at least one comprises" and insert therefore -- at least one via comprises --.

Signed and Sealed this  
Thirty-first Day of March, 2020

Andrei Iancu  
*Director of the United States Patent and Trademark Office*